United States Patent
Lee

(10) Patent No.: US 7,269,043 B2
(45) Date of Patent: Sep. 11, 2007

(54) MEMORY MODULE AND IMPEDANCE CALIBRATION METHOD OF SEMICONDUCTOR MEMORY DEVICE

(75) Inventor: Jung-Bae Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 11/082,551

(22) Filed: Mar. 17, 2005

(65) Prior Publication Data

US 2005/0226080 A1    Oct. 13, 2005

(30) Foreign Application Priority Data

Apr. 13, 2004    (KR) .................. 10-2004-0025518

(51) Int. Cl.
*G11C 5/06* (2006.01)
(52) U.S. Cl. ................ 365/63; 365/52; 365/201
(58) Field of Classification Search ............. 365/201, 365/194, 189.07, 63, 52
See application file for complete search history.

(56) References Cited

U.S. PATENT DOCUMENTS 6,484,232 B2 * 11/2002 Olarig et al. ............ 711/105
6,791,865 B2 * 9/2004 Tran et al. ............... 365/158
6,958,613 B2 * 10/2005 Braun et al. .............. 324/601

FOREIGN PATENT DOCUMENTS

| JP | 07-240498 | 9/1995 |
| JP | 2002-023901 | 1/2002 |
| JP | 2002-237180 | 8/2002 |

* cited by examiner

*Primary Examiner*—Anh Phung
*Assistant Examiner*—N Nguyen
(74) *Attorney, Agent, or Firm*—F. Chau & Associates, LLC

(57) ABSTRACT

Disclosed is a memory module and a method of calibrating an impedance of a semiconductor memory device of the memory module, where the memory module includes semiconductor memory devices each having a separate terminal for calibrating impedance characteristics, and a reference resistor commonly connected to the separate terminals, such that the number of reference resistors used in calibration of impedance characteristics of an off-chip driver or an on-die termination circuit of the semiconductor memory device is reduced.

8 Claims, 10 Drawing Sheets

MEMORY MODULE AND IMPEDANCE CALIBRATION METHOD OF SEMICONDUCTOR MEMORY DEVICE

BACKGROUND OF THE INVENTION

1. Field of the Invention

The present disclosure relates to memory modules and, more particularly, to a memory module and an impedance calibration method of a semiconductor memory device.

2. Description of the Related Art

Semiconductor integrated circuit (IC) devices such as microcontrollers and memory devices receive and transmit data from/to other semiconductor IC devices through a transmission line. For this reason, most semiconductor IC circuit devices include an off-chip driver (OCD) for outputting signals to an external portion from the semiconductor IC device, and an on-die termination circuit (ODT) for preventing a reflection of signals transmitted to the semiconductor IC device from an external portion. In this case, in order to secure signal integrity, it is required to calibrate impedance characteristics of the off-chip driver or the on-die termination circuit. As systems operate at increasingly higher speeds, the need for calibration is also increased.

Some semiconductor memory devices include a separate ZQ terminal to calibrate impedance characteristics of the off-chip driver or the on-die termination circuit. A reference resistor is connected directly to the ZQ terminal, so that an impedance calibration is performed in proportion to an impedance of the reference resistor.

FIG. 1 is a block diagram illustrating a conventional impedance calibration circuit using a ZQ terminal. The impedance calibration circuit of FIG. 1 includes variable impedance circuits 10, 30 and 70, up-down counters 20 and 60, and comparators 40 and 50. The variable impedance circuits 10, 30 and 70 include a PMOS transistor array or an NMOS transistor array. The two variable impedance circuits 10 and 30 have the same configuration as a pull-up circuit of the off-chip driver or the on-die termination circuit. The variable impedance circuit 70 has the same configuration of a pull-down circuit of the off-chip driver or the on-die termination circuit.

In FIG. 1, "VREF" represents a reference voltage, and "UPcode" and "DNcode" represent an n-bit impedance control code which is used to selectively turn on or off the PMOS transistors and NMOS transistors that constitute the variable impedance circuits 10, 30 and 70, to thereby vary an impedance of the variable impedance circuits 10, 30 and 70. Here, "n" represents the number of PMOS or NMOS transistors. "UPcode" and "DNcode" are also applied to the off-chip driver or the on-die termination circuit of a semiconductor memory device, so that PMOS and NMOS transistors, which constitute a pull-up circuit or a pull-down circuit of the off-chip driver or the on-die termination circuit, are turned on or off identically to the PMOS and NMOS transistors, which constitute the variable impedance circuits 10, 30 and 70.

The functions of the components of FIG. 1 are explained below. The first variable impedance circuit 10 and the second variable impedance circuit 30 vary an internal impedance thereof in response to a first impedance control code UPcode. The first up-down counter 20 converts the first impedance control code UPcode in response to a first counter control signal, which is an output signal of the first comparator 40. The first comparator 40 outputs the first counter control signal according to whether or not a voltage of a ZQ terminal is higher than a reference voltage VREF. The second comparator 50 outputs a second counter control signal according to whether or not a voltage of a node A is higher than a voltage of the ZQ terminal. The second up-down counter 60 converts a second impedance control code DNcode in response to the second counter control signal. The third variable impedance circuit 70 varies an internal impedance thereof in response to the second impedance control code DNcode.

Hereinafter, an impedance calibration method using the ZQ terminal is explained with reference to FIG. 1. The first comparator 40 detects whether or not a voltage of a ZQ terminal is higher than a reference voltage VREF to output a first counter control signal. A level of a reference voltage VREF is previously set to a half level of a power voltage VDD. The first up-down counter 20 converts a first impedance control code UPcode in response to a first counter control signal. That is, if a voltage of the ZQ terminal is higher than a reference voltage VREF, this means that an impedance of the first variable impedance circuit 10 is smaller than an impedance of a reference resistor RQ, and thus the first impedance control code UPcode is converted to increase an impedance of the first variable impedance circuit 10 to be higher than a current value. On the other hand, if a voltage of the ZQ terminal is lower than a reference voltage VREF, this means that an impedance of the first variable impedance circuit 10 is larger than an impedance of a reference resistor RQ, and thus a first impedance control code UPcode is converted to decrease an impedance of the first variable impedance circuit 10 to be smaller than a current value. The first impedance control code UPcode is identically applied to the second variable impedance circuit 30, so that an impedance of the second variable impedance circuit 30 has the same value as that of the first variable impedance circuit 10. Accordingly, an impedance of the variable impedance circuits 10 and 30 has the same value as an impedance of the reference resistor RQ. In addition, a voltage level of a ZQ terminal becomes a reference voltage VREF, i.e., a half level of a power voltage VDD.

The second comparator 50 detects whether or not a voltage of a node A is higher than a voltage of a ZQ terminal to a second counter control signal. The second up-down counter 60 converts a second impedance control code DNcode in response to a second counter control signal. That is, if a voltage of a node A is higher than a voltage of a ZQ terminal, this means that an impedance of the third variable impedance circuit 70 is larger than an impedance of the second variable impedance circuit 30, and thus a second impedance control code DNcode is converted to decrease an impedance of the third variable impedance circuit 70 to be smaller than a current value. If a voltage of a node A is lower than a voltage of a ZQ terminal, this means that an impedance of the third variable impedance circuit 70 is smaller than an impedance of the second variable impedance circuit 30, and thus a second impedance control code DNcode is converted to increase an impedance of the third variable impedance circuit 70 to be larger than a current value. Accordingly, an impedance of the third variable impedance circuit 70 has the same value as an impedance of the second variable impedance circuit 30. That is, the impedance of the variable impedance circuits 10, 30 and 70 becomes equal to an impedance of reference resistor RQ.

The impedance control codes UPcode and DNcode are identically applied to the pull-up circuit or the pull-down circuit of the off-chip driver or the on-die termination circuit, and thus an impedance of the off-chip driver or the on-die termination circuit has the same value as an impedance of the variable impedance circuits 30 and 70, i.e., an impedance of the reference resistor RQ.

The impedance calibration using a ZQ terminal, as described above, has been typically employed in small-sized memory systems. However, a main memory that uses a memory module also requires an impedance calibration to improve the accuracy of an impedance.

FIG. 2 is a block diagram illustrating a memory module using a semiconductor memory device, which calibrates impedance characteristics of an off-chip driver or an on-die termination circuit by using a ZQ terminal. The memory module of FIG. 2 includes a plurality of semiconductor memory devices 90-1 to 90-9 and a plurality of reference resistors RQ. In FIG. 2, "cal" represents a calibration command applied from an external portion.

Functions of the components of the memory module of FIG. 2 are explained below. A plurality of semiconductor memory devices 90-1 to 90-9 perform a read operation or a write operation in response to various control signals that are applied from a memory controller (not shown), and calibrates impedance characteristics of an off-chip driver or an on-die termination circuit according to an impedance value of the reference resistor RQ when a calibration command "cal" is applied. The reference resistors RQ are mounted on the memory module and have one end connected to a ground voltage and the other end connected to a ZQ terminal of the semiconductor memory device. Generally, an impedance value of the reference resistors RQ is six to ten times that of a target impedance of the off-chip driver or the on-die termination circuit. One end of the reference resistor RQ is typically connected to a ground voltage, but can be connected to a power voltage.

However, if the memory module, including the semiconductor memory devices that calibrate an impedance calibration using a ZQ terminal, is configured as shown in FIG. 2, the number of the reference resistors mounted on the memory module is increased, which complicates the wiring and causes inefficiencies in cost and space.

SUMMARY OF THE INVENTION

It is a feature of an exemplary embodiment of the present disclosure to provide a memory module that calibrates impedance characteristics of a plurality of semiconductor memory devices using a single reference resistor. It is another a feature of an exemplary embodiment to provide an impedance calibration method of a semiconductor memory device which can calibrates impedance characteristics of a plurality of semiconductor memory devices using a single reference resistor.

These features are provided by a memory module, including a plurality of semiconductor memory devices, each respectively having a separate terminal for calibrating impedance characteristics, and a reference resistor commonly connected to the separate terminals. A resistance value of the reference resistor depends on the number of the semiconductor memory devices commonly coupled to the reference resistor.

The plurality of semiconductor memory devices includes a control signal generating portion for outputting a control signal in accordance with the number of the semiconductor memory devices commonly coupled to the reference resistor in response to a calibration command applied from an external portion, and an impedance calibration portion for calibrating impedance characteristics of the semiconductor memory device in response to the control signal. The impedance calibration portion includes a first comparator for comparing a voltage of the separate terminal to a reference voltage to generate a first counter control signal, a first up-down counter for converting a first impedance control code in response to the first counter control signal, a first variable impedance circuit for being coupled between the separate terminal and a power voltage and for varying an impedance in response to the first impedance control code, a converting portion for converting the first impedance control code in response to the control signal, a second variable impedance circuit for being coupled between the power voltage and an intermediate node and for varying an impedance in response to an output code of the converting portion, a second comparator for comparing a voltage of the separate terminal and a voltage of the intermediate node to generate a second counter control signal, a second up-down counter for converting a second impedance control code in response to the second counter control signal, and a third variable impedance circuit for being coupled between a ground voltage and the intermediate node and for varying an impedance in response to the second impedance control code.

An exemplary embodiment of the present disclosure further provides a memory module including a plurality of semiconductor memory devices each respectively having a separate terminal for calibrating impedance characteristics, an input terminal, and an output terminal, and a reference resistor commonly coupled to the separate terminals wherein the respective input terminals of the plurality of the semiconductor memory devices are coupled to the output terminal of the respective semiconductor memory device of a preceding stage, so that the plurality of the semiconductor memory devices perform an impedance calibration sequentially.

The plurality of the semiconductor memory devices perform an impedance calibration when a signal applied to the input terminal is activated, and activate a signal outputted to the output terminal when the impedance calibration is completed, respectively. The plurality of the semiconductor memory devices includes a delay portion for delaying a signal applied to the input terminal during a predetermined time period and outputting the signal to the output terminal, a control signal generating portion for outputting a control signal in response to a signal applied to the input terminal, an output signal of the delay portion, and a calibration command applied from an external portion, and an impedance calibration portion for calibrating impedance characteristics of the semiconductor memory device in response to the control signal.

In another exemplary embodiment, the plurality of semiconductor memory devices may include a detecting portion for activating a signal outputted to the output terminal when a signal applied to the input terminal is activated and a difference between an impedance of the reference resistor and a calibrated impedance is below a predetermined value, a control signal generating portion for outputting a control signal in response to a signal applied to the input terminal, an output signal of the detecting portion, and a calibration command applied from an external portion, and an impedance calibration portion for calibrating impedance characteristics of the semiconductor memory device in response to the control signal.

An exemplary embodiment of the present disclosure further provides a memory module, including a plurality of semiconductor memory devices each respectively having a separate terminal for calibrating impedance characteristics, and a terminal for receiving a selection signal for selecting a semiconductor memory device which is to perform an impedance calibration, and a reference resistor commonly coupled to the separate terminals, wherein the semiconductor memory devices perform an impedance calibration when the selection signal is activated. The selection signal is a data masking signal or one of input/output data signals.

The plurality of the semiconductor memory devices includes a control signal generating portion for outputting a control signal in response to the calibration command applied from an external portion and the selection signal, and an impedance calibration portion for calibrating impedance characteristics of the semiconductor memory device in response to the control signal.

An exemplary embodiment of the present disclosure further provides a method of calibrating an impedance of a semiconductor memory device in a memory module having a plurality of semiconductor memory devices, which respectively include a separate terminal for calibrating impedance characteristics, the method including calibrating impedance characteristics by using a reference resistor commonly coupled to the separate terminals. A resistance value of the reference resistor is determined by the number of semiconductor memory devices commonly coupled to the reference resistor.

This method of calibrating an impedance of the semiconductor memory device further includes generating a control signal in accordance with the number of semiconductor memory devices commonly coupled to the reference resistor, and calibrating impedance characteristics of the semiconductor memory device in response to the control signal.

The step of calibrating impedance characteristics includes a control code generating step of converting an impedance control code in response to a reference voltage and a voltage of the separate terminal, a first impedance calibrating step of varying an impedance of a first variable impedance circuit in response to the impedance control code, a control code converting step of converting the impedance control code in response to an information signal, a second impedance calibrating step of varying an impedance of a second variable impedance circuit in response to the converted control code, and a third impedance calibrating step of varying an impedance of a third variable impedance circuit in response to a voltage of an intermediate node between the first variable impedance circuit and the second variable impedance circuit and a voltage of the separate terminal.

An exemplary embodiment of the present disclosure further provides a method of calibrating an impedance of a semiconductor memory device in a memory module having a plurality of semiconductor memory devices, which respectively include a separate terminal for calibrating impedance characteristics, an input terminal and an output terminal, the method including performing sequentially an impedance calibration operation by using a reference resistor commonly connected to the plurality of semiconductor memory devices, wherein the respective input terminals of the semiconductor memory devices are connected to the output terminal of the respective semiconductor memory device of a preceding stage.

Each of the semiconductor memory devices performs an impedance calibration when a signal applied to the input terminal is activated, and activates a signal outputted to the output terminal when the impedance calibration is completed. A time when the impedance calibration is completed is a time when a predetermined time elapses after the signal applied to the input terminal is activated. A time when the impedance calibration is completed is a time when a difference between an impedance of the reference resistor and a calibrated impedance is below a predetermined value.

An exemplary embodiment of the present disclosure further provides a method of calibrating an impedance of a semiconductor memory device in a memory module having a plurality of semiconductor memory devices, which respectively include a separate terminal for calibrating impedance characteristics, and a terminal for receiving a selection signal for selecting the semiconductor memory device which is to perform an impedance calibration, the method including performing an impedance calibration operation by using a reference resistor commonly connected to the separate terminals when the selection signal is activated.

BRIEF DESCRIPTION OF THE DRAWINGS

The above and other features and advantages of the present disclosure will become more apparent to those of ordinary skill in the pertinent art by describing in detail preferred embodiments thereof with reference to the attached drawings, in which.

DETAILED DESCRIPTION OF PREFERRED EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the pertinent art. Like reference numbers may refer to like elements throughout the specification.

Figure 3:
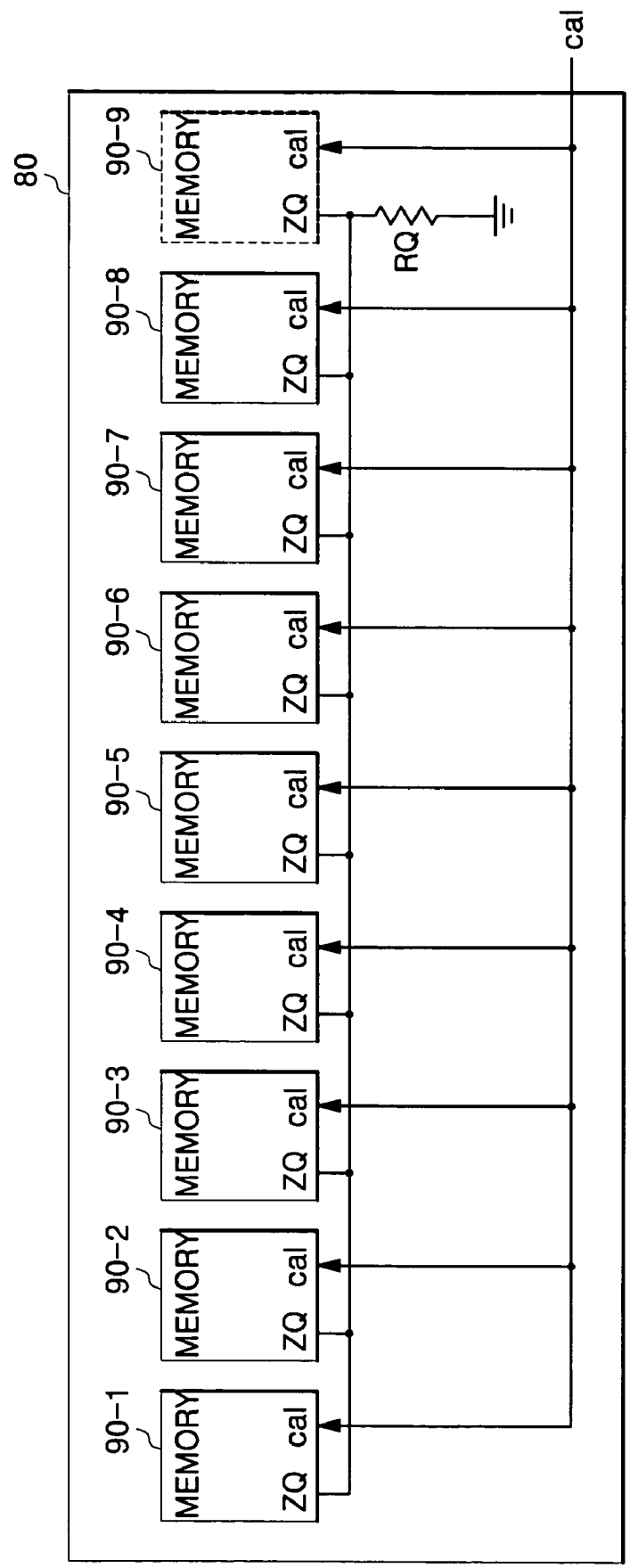
FIG. 3 is a block diagram illustrating a memory module according to an embodiment of the present disclosure.

FIG. 3 is a block diagram illustrating a memory module according to an embodiment of the present disclosure. The memory module of FIG. 3 includes a plurality of semiconductor memory devices 90-1 to 90-9, and a single reference resistor RQ. The plurality of semiconductor memory devices 90-1 to 90-9 have separate ZQ terminals for calibrating impedance characteristics of semiconductor memory devices.

Figure 2:
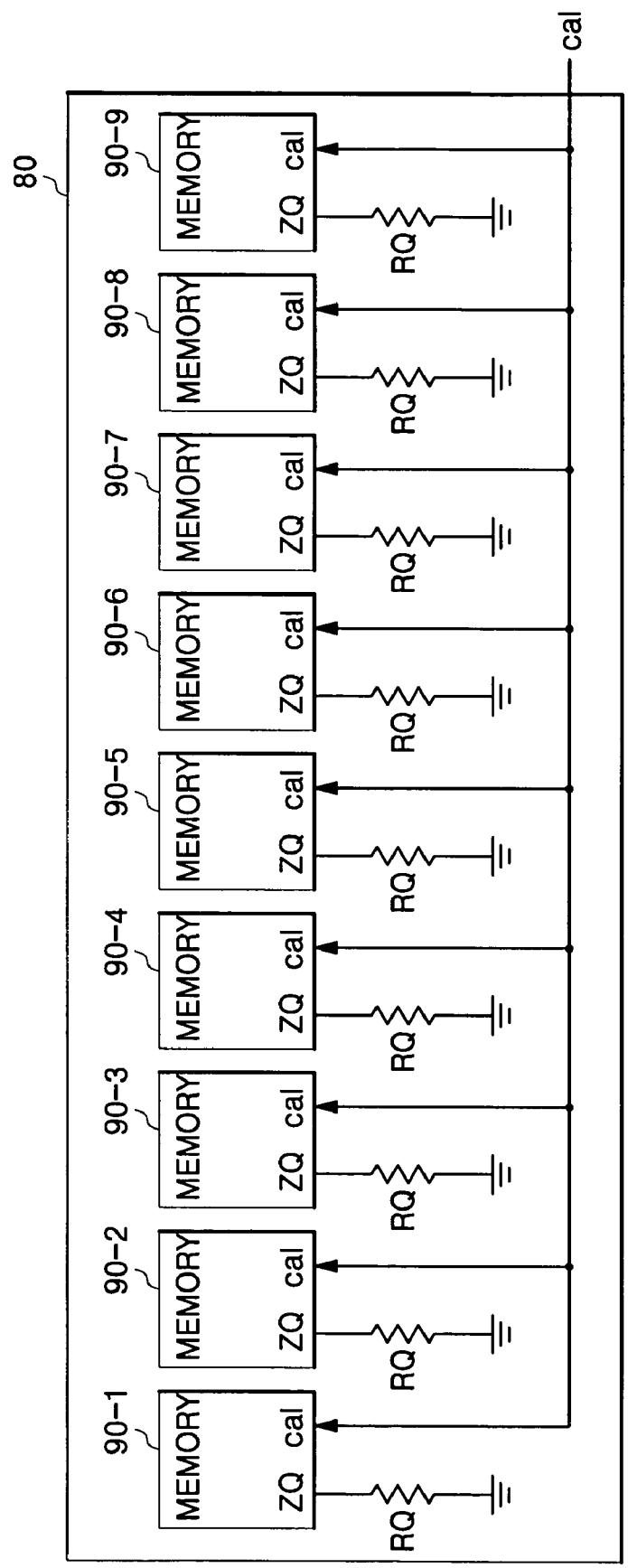
FIG. 2 is a block diagram illustrating a memory module using a semiconductor memory device, which calibrates impedance characteristics of an off-chip driver or an on-die termination circuit by using a ZQ terminal.

Functions of the components of the memory module of FIG. 3 are like those of FIG. 2 except that the nine semiconductor memory devices 90-1 to 90-9 are connected to the reference resistor RQ in parallel. Hence, an impedance of the reference resistor RQ is a ninth (⅑) of that of FIG. 2. That is, an impedance of the reference resistor RQ is determined by the number of semiconductor memory devices that share the reference resistor RQ. An impedance of the reference resistor RQ is a ninth of that of FIG. 2 in the case that the memory module of FIG. 3 is of one rank, and thus an impedance of the reference resistor RQ depends on whether the memory module is of one rank, two ranks or four ranks.

That is, the memory module of FIG. 3 is configured such that each of the semiconductor memory devices do not have a separate reference resistor but one reference resistor is connected to all the semiconductor memory devices using the ZQ terminals. Accordingly, the number of reference resistors mounted on the memory module is decreased, leading to a simpler wiring and a lower cost.

In addition, in the memory module of FIG. 3, impedance characteristics of the off-chip driver or the on-die termination circuit of all semiconductor memory devices mounted on the memory module are simultaneously calibrated. Thus, a parallel impedance of the off-chip driver or the on-die termination circuit of a plurality of semiconductor memory devices is equal to an impedance of the reference resistor RQ. Hence, an impedance of the off-chip driver or on-die termination circuit of all semiconductor memory devices is not calibrated exactly to an impedance of the reference resistor RQ but to an impedance similar to an impedance of the reference resistor RQ.

Figure 4:
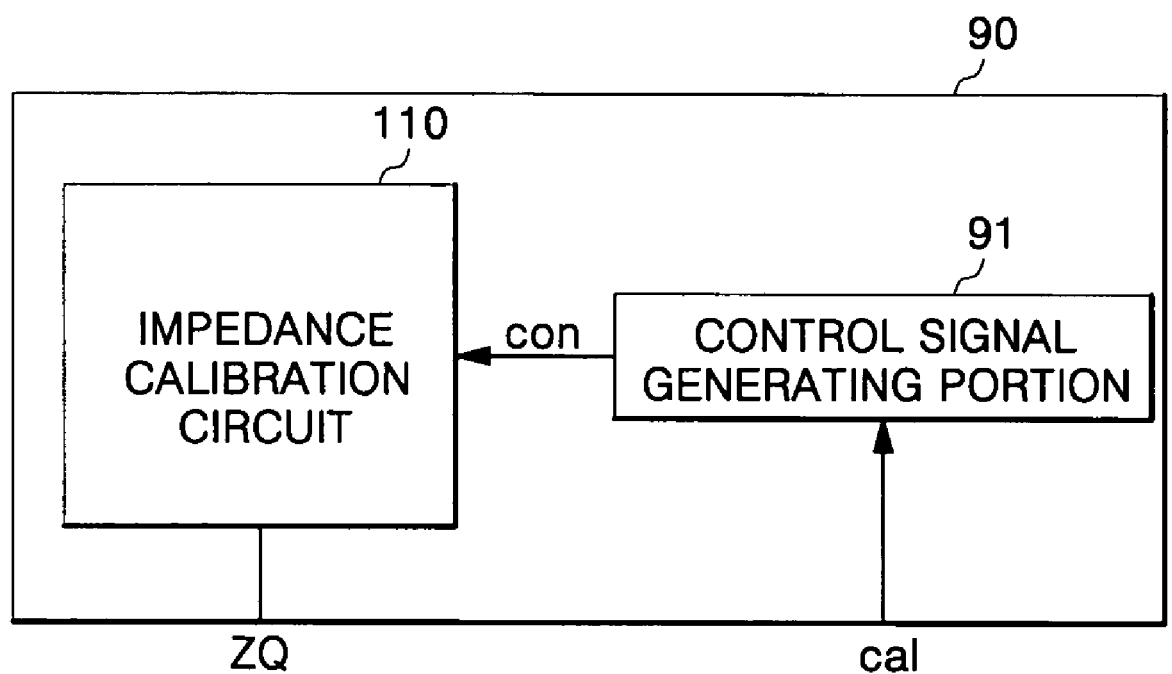
FIG. 4 is a block diagram illustrating a semiconductor memory device of the memory module of FIG. 3.

FIG. 4 is a block diagram illustrating the semiconductor memory device of the memory module of FIG. 3. The semiconductor memory device of FIG. 4 includes a control signal generating portion 91 and an impedance calibration circuit 110.

Functionality of the components of the semiconductor memory device of FIG. 4 is explained below. The control signal generating portion 91 outputs a control signal "con", which depends on the number of semiconductor memory devices commonly coupled to the reference resistor RQ, to the impedance calibration circuit 110 in response to a calibration command "cal" applied from an external portion. For example, the control signal generating portion 91 receives a calibration command "cal" applied from an external portion to generate the control signal "con" in response to a mode setting command. The impedance calibration circuit 110 calibrates an impedance of the semiconductor memory device in response to the control signal "con". In addition, as shown in FIG. 3, in the case that the memory module is of one rank, eight or nine semiconductor memory devices are commonly coupled to the reference resistor RQ. The impedance calibration circuit 110 of FIG. 4 can calibrate an impedance of the semiconductor memory devices to the same impendence as when nine semiconductor memory devices are connected to the reference resistor RQ even when eight semiconductor memory devices are connected to the reference resistor RQ. The impedance calibration circuit 110 operates the same way in cases where the memory module is of two ranks or four ranks.

Figure 5:
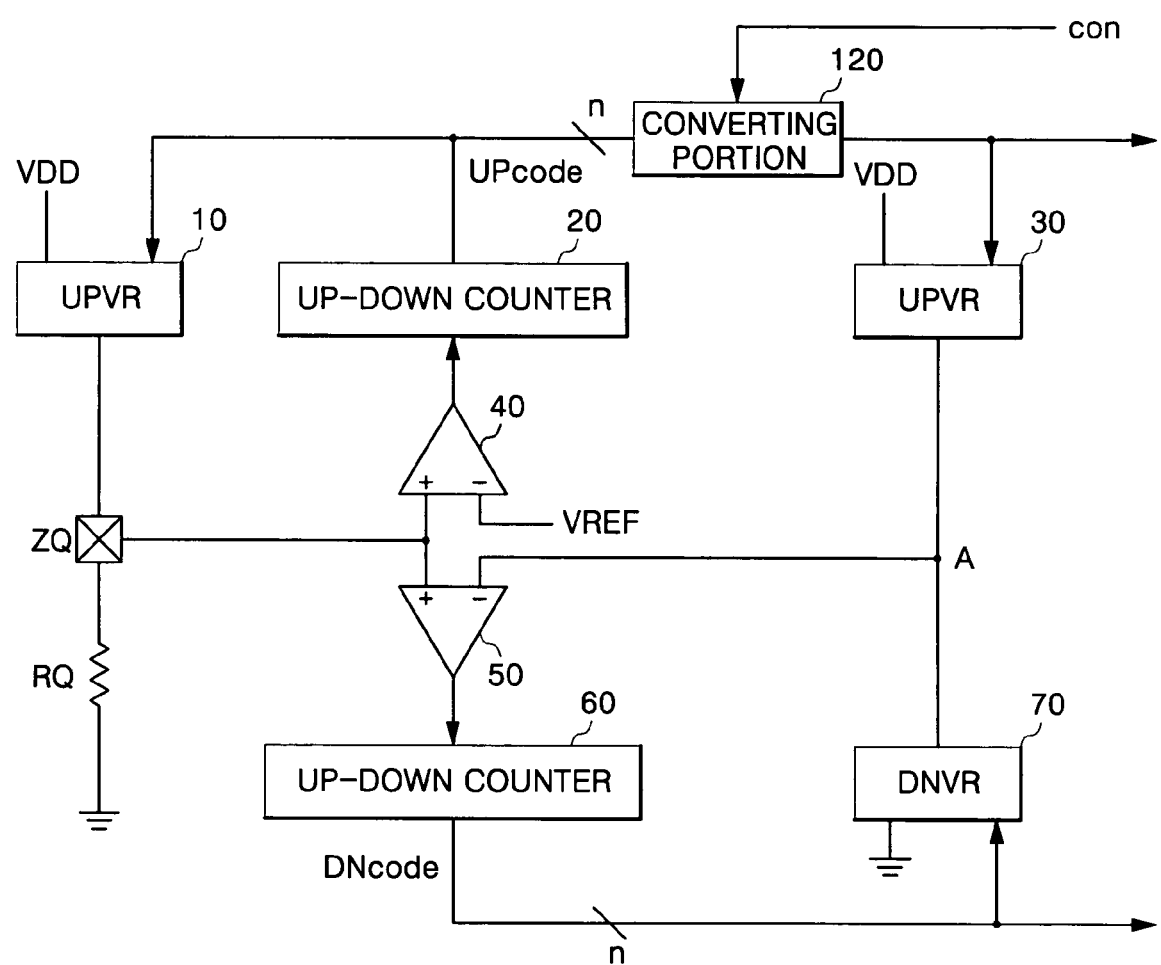
FIG. 5 is a block diagram illustrating an impedance calibration circuit of the semiconductor memory device of FIG. 4.

FIG. 5 is a block diagram illustrating the impedance calibration circuit of the semiconductor memory device of FIG. 4. The impedance calibration circuit of FIG. 5 includes variable impedance circuits 10, 30, and 70, up-down counters 20 and 60, comparators 40 and 50, and a converting portion 120. That is, the impedance calibration circuit of FIG. 5 has additionally the converting portion 120 added to a configuration of the impedance calibration circuit of FIG. 1. In FIG. 5, "con" denotes a control signal that is generated from the control signal generating portion 91.

Functions of the components of FIG. 5 are explained below. Like components of FIGS. 1 and 5 perform like operations. The converting portion 120 converts a first impedance control code UPcode according to the number of semiconductor memory devices commonly coupled to the reference resistor RQ, and outputs it to the second variable impedance circuit 30 in response to the control signal "con". The control code converted by the converting portion 120 is equally applied to a pull up circuit of the off-chip driver or the on-die termination circuit of the semiconductor memory device.

A method of calibrating an impedance of the semiconductor memory device of the exemplary memory module of FIG. 3 to FIG. 5 is explained below. The method of calibrating an impedance of the semiconductor memory device of the present disclosure is like the method described in FIG. 1 except that a step is added of converting the first impedance control code UPcode in accordance with the number of semiconductor memory devices which are commonly connected to the reference resistor RQ. That is, the control signal generating portion 91 provides the converting portion 120 with information about the number of semiconductor memory devices commonly connected to the reference resistor RQ. The converting portion 120 converts the first impedance control code UPcode applied to the first variable impedance circuit 10 according to the information and then applies it to the second variable impedance circuit 30.

Figure 1:
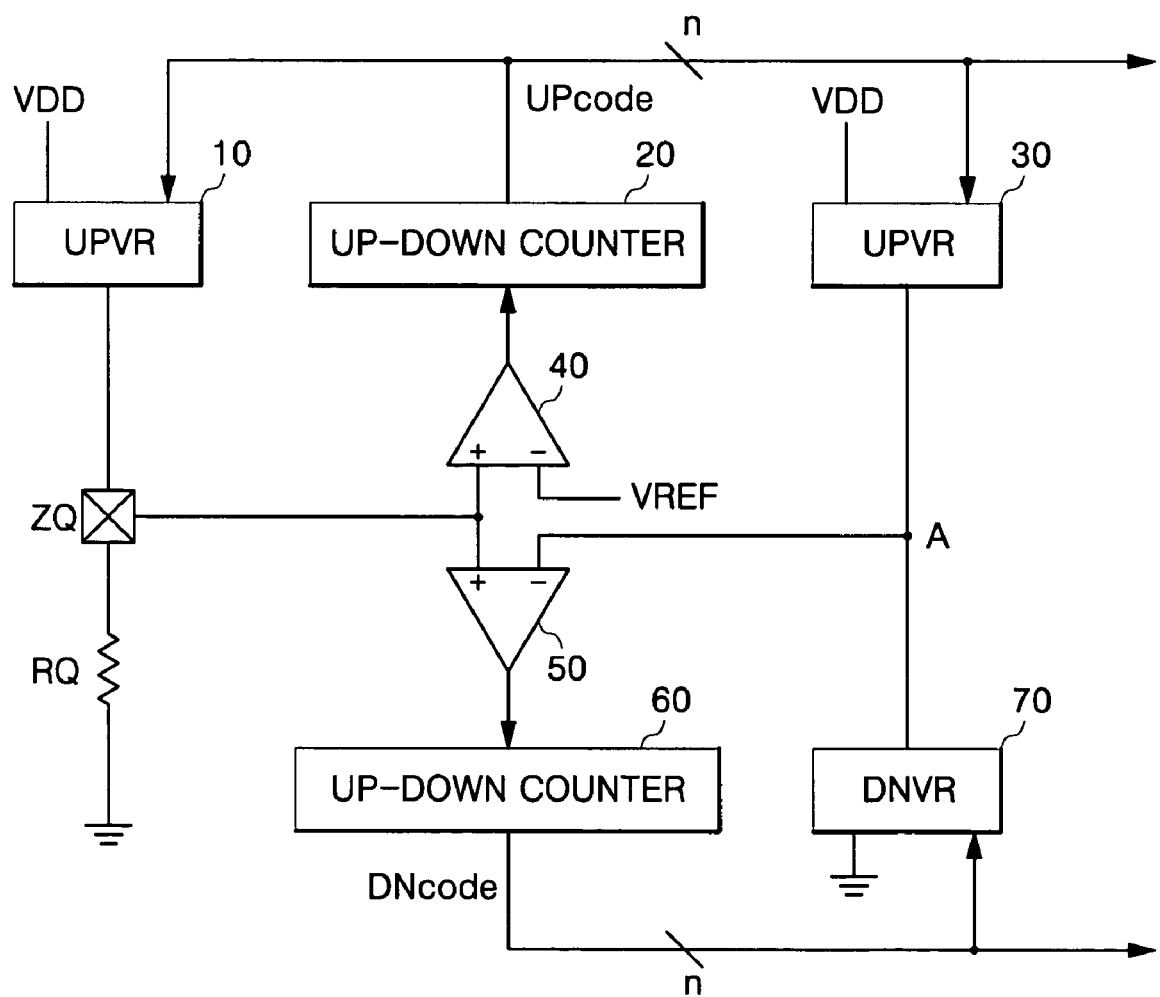
FIG. 1 is a block diagram illustrating a conventional impedance calibration circuit using a ZQ terminal.

For example, if it is to calibrate an impedance of each semiconductor memory device of FIG. 3 to be 90 [Ω], an impedance of the reference resistor RQ becomes 10 [Ω], i.e., a ninth of 90 [Ω]. If 8 semiconductor memory devices are mounted on the memory module, a parallel impedance of the first variable impedance circuits 10 of the 8 semiconductor memory devices is calibrated to be 10 [Ω], and thus an impedance of the first variable impedance circuits 10 of each semiconductor memory device is calibrated to be 80 [Ω]. Therefore, the converting portion 120 converts the first impedance control code UPcode so that a ratio between an impedance of the first variable impedance circuit 10 and an impedance of the second variable impedance circuit 30 is 8:9, and then applies the converted control code UPcode to the second variable impedance circuit 30. Accordingly, an impedance of the second variable impedance circuit 30 is calibrated to 90 [Ω]. Then, the procedure portion described in FIG. 1 is performed and thus an impedance of the third variable impedance circuit 70 is calibrated to 90 [Ω], which is equal to an impedance of the second variable impedance circuit 30.

Figure 6:
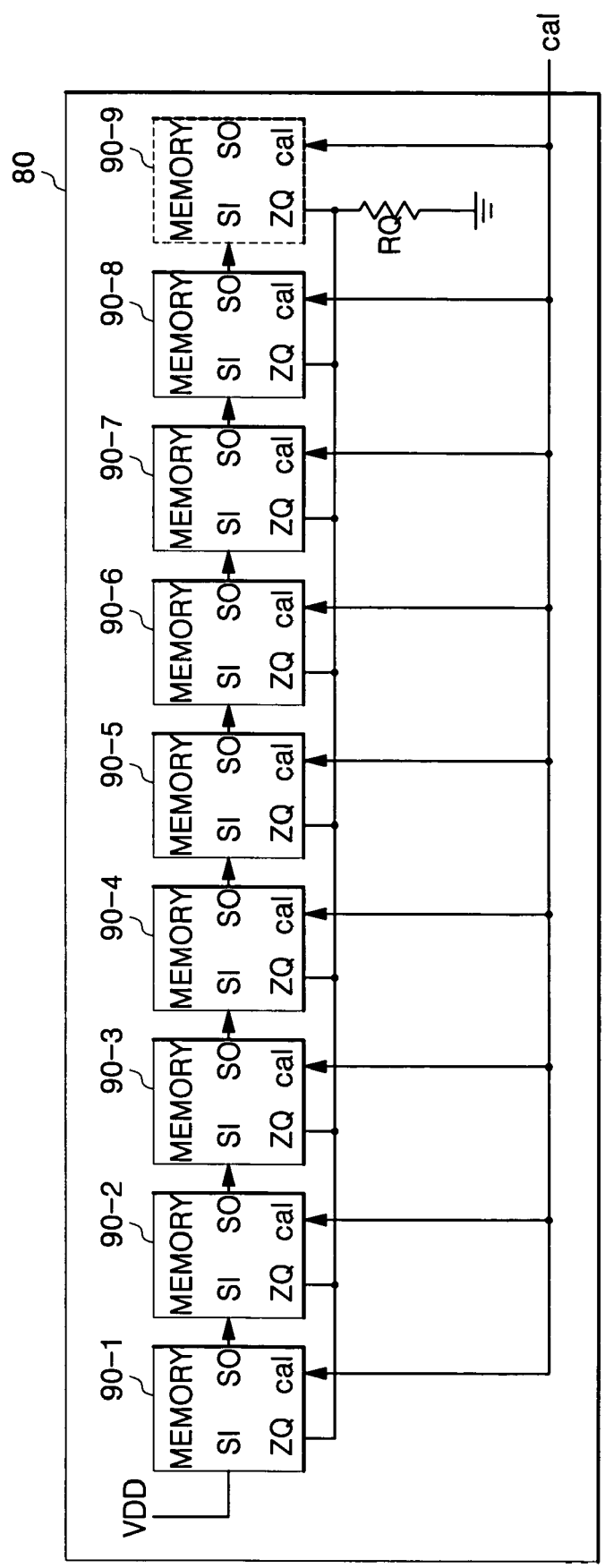
FIG. 6 is a block diagram of a memory module according to another embodiment of the present disclosure.

FIG. 6 is a block diagram of a memory module according to another embodiment of the present disclosure. The memory module of FIG. 6 includes a plurality of semiconductor memory devices 90-1 to 90-9 and a single reference resistor RQ. Each of the semiconductor memory devices includes a separate ZQ terminal for calibrating impedance characteristics thereof, an input terminal SI and an output terminal SO. The input terminal SI of each semiconductor memory device is connected to the output terminal SO of the respective semiconductor memory device of a preceding stage. The input terminal SI of the first semiconductor memory device 90-1 is connected to a power voltage VDD. Functionality of the components of FIG. 6 is the same as those of FIG. 2, and a resistance value of the reference resistor RQ is the same as that of FIG. 2.

A method of calibrating an impedance of the memory module according to another embodiment of the present disclosure is explained below. Each semiconductor memory device performs an impedance calibration when an impedance calibration command "cal" is applied from an external portion and a signal of a high level is applied to the input terminal SI, and outputs a signal of a high level to the output terminal SO after performing the impedance calibration. Therefore, if an impedance calibration command "cal" is applied an external portion, the first semiconductor memory device 90-1 performs an impedance calibration. The first semiconductor memory device 90-1 outputs a signal of a high level to the second semiconductor memory device 90-2 through the output terminal SO when the calibration is completed. Thereafter, the semiconductor memory devices 90-2 to 90-9 sequentially perform an impedance calibration in the same way. A time when a calibration is completed is a time when a predetermined time elapses after a signal of a high level is applied to the input terminal SI or a time when a difference between an impedance calibrated by performing a calibration and an impedance of the reference resistor RQ is less than or equal to a predetermined value.

That is, the memory module of FIG. 6 sequentially calibrates an impedance of the off-chip driver or the on-die termination circuit of the plurality of semiconductor memory devices 90-1 to 90-9 to an impedance of the reference resistor RQ. Accordingly, impedance characteristics of semiconductor memory devices 90-1 to 90-9 of FIG. 6 can be more precisely calibrated than as in FIG. 3.

Figure 7:
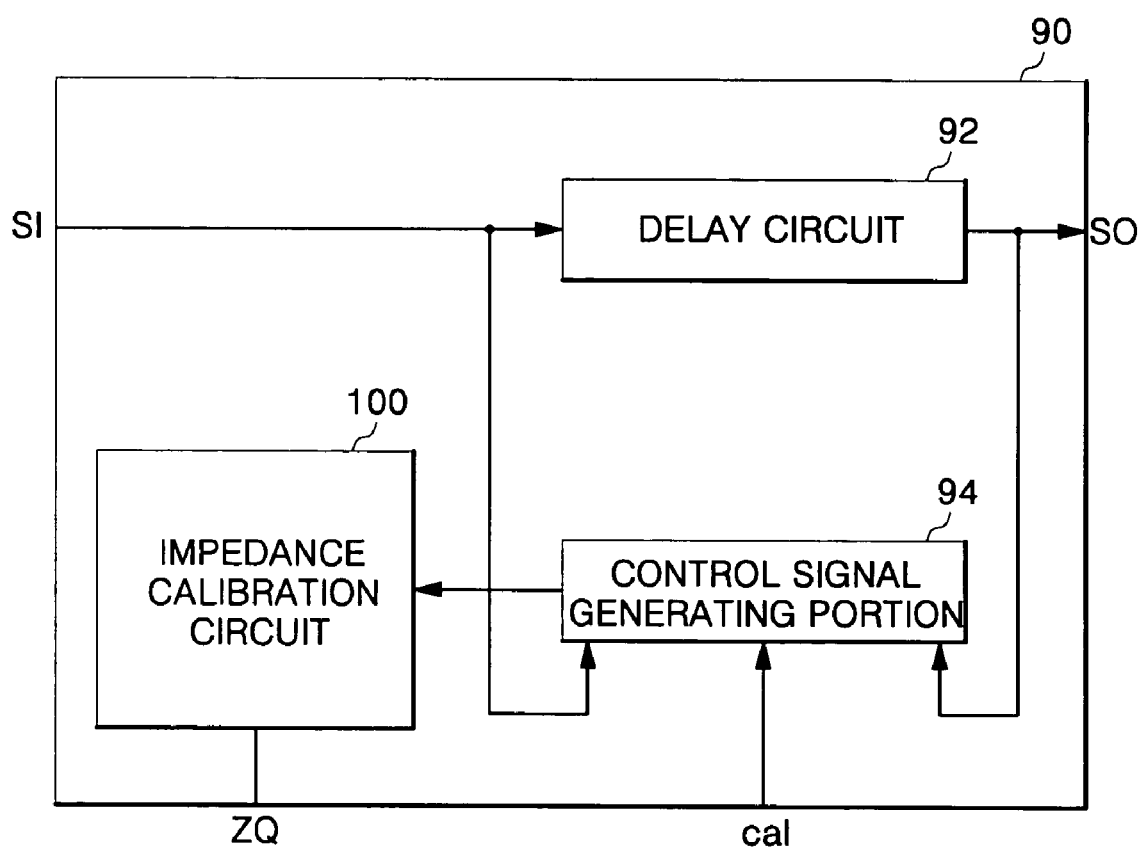
FIG. 7 is a block diagram illustrating a semiconductor memory device of the memory module of FIG. 6.

FIG. 7 is a block diagram illustrating a semiconductor memory device of the memory module of FIG. 6. The semiconductor memory device of FIG. 7 includes an impedance calibration circuit 100, a delay circuit 92, and a control signal generating portion 94. The impedance calibration circuit 100 has the same configuration as that of FIG. 1. In FIG. 7, "SI" and "SO" respectively denote an input terminal and an output terminal of the semiconductor memory device, "ZQ" represents a terminal to which the reference resistor RQ is connected, and "cal" represents an impedance calibration command applied from an external portion.

Functions of the components of FIG. 7 are explained below. The delay circuit 92 delays a signal applied to the input terminal SI during a predetermined time period and outputs it to the output terminal SO. The control signal generating portion 94 outputs a control signal to the impedance calibration circuit 100 in response to an impedance calibration command "cal" applied from an external portion, a signal applied to the input terminal SI, and an output signal of the delay circuit 92. The impedance calibration circuit 100 performs an impedance calibration of the semiconductor memory device in response to a control signal outputted from the control signal generating portion 94.

That is, the semiconductor memory device 90 of FIG. 7 calibrates an impedance thereof when an impedance calibration command "cal" is applied from an external portion and a signal applied to the input terminal SI is activated. When a signal applied to the input terminal SI is activated and a predetermined time elapses, the delay circuit 92 activates a signal to be outputted to the output terminal SO, whereby the semiconductor memory device 90 finishes an impedance calibration.

Figure 8:
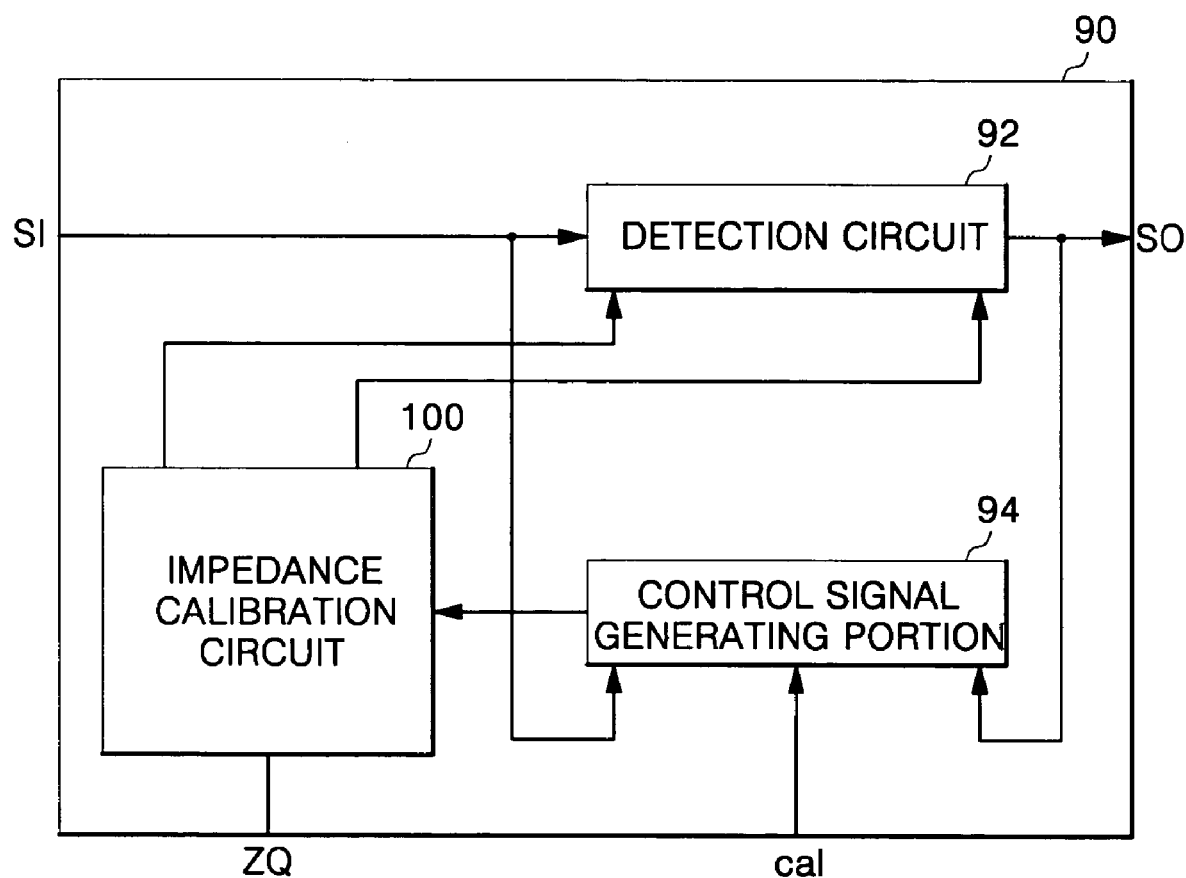
FIG. 8 is a block diagram illustrating another embodiment of the semiconductor memory device of the memory module of FIG. 6.

FIG. 8 is a block diagram illustrating another embodiment of a semiconductor memory device of the memory module of FIG. 6. The semiconductor memory device of FIG. 8 includes an impedance calibration circuit 100, a detection circuit 93, and a control signal generating portion 94. The impedance calibration circuit 100 has the same configuration as that of FIG. 1. In FIG. 7, "SI" and "SO" respectively denote an input terminal and an output terminal of the semiconductor memory device, "ZQ" represents a terminal to which the reference resistor RQ is connected, and "cal" represents an impedance calibration command applied from an external portion.

Functions of the components of FIG. 8 are explained below. When a signal is applied to the input terminal SI, the detection circuit 93 receives information about an impedance of the reference resistor and a calibrated impedance of the semiconductor memory device and activates a signal outputted to the output terminal SO if a difference between an impedance of the reference resistor and a calibrated impedance is below a predetermined value. That is, the impedance calibration circuit 100 has a configuration like that of FIG. 1. Thus, as in FIG. 1, if a difference between a voltage of the ZQ terminal and a voltage of a node A is below a predetermined value, then a difference between an impedance of the semiconductor memory device and an impedance of the reference resistor is also considered to be below a predetermined value. Accordingly, the detection circuit 93 activates a signal outputted to the output terminal SO if a difference between a voltage of the ZQ terminal and a voltage of a node A in the impedance calibration circuit Figure is below a predetermined value.

The control signal generating portion 94 outputs a control signal to the impedance calibration circuit 100 in response to an impedance calibration command "cal" applied from an external portion, a signal applied to the input terminal SI, and an output signal of the detection circuit 92. The impedance calibration circuit 100 calibrates an impedance of the semiconductor memory device in response to a control signal outputted from the control signal generating portion 94.

That is, the semiconductor memory device of FIG. 8 performs an impedance calibration of the semiconductor memory device 90 when an impedance calibration command "cal" is applied and a signal applied to the input terminal SI is activated. The detection circuit 93 compares a voltage of the ZQ terminal to a voltage of the node A Figure to detect a difference between an impedance of the reference resistor RQ and an impedance of semiconductor memory device, and activates a signal outputted to the output terminal SO when the difference is determined to be below a predetermined value. Thus, an impedance calibration of the semiconductor memory device 90 is completed.

Figure 9:
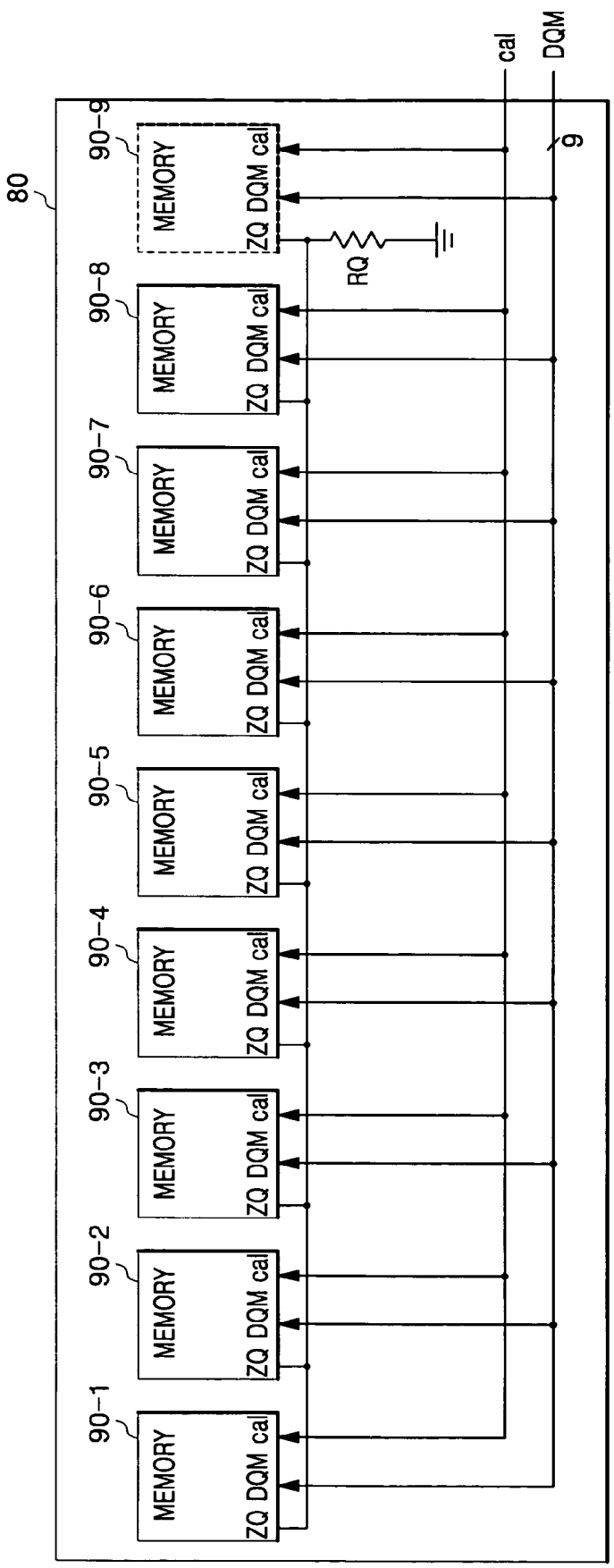
FIG. 9 is a block diagram illustrating a memory module according to another embodiment of the present disclosure.

FIG. 9 is a block diagram illustrating a memory module according to another embodiment of the present disclosure. The memory module of FIG. 9 includes a plurality of semiconductor memory devices 90-1 to 90-9 and a single reference resistor RQ. Each of the semiconductor memory devices includes a separate ZQ terminal for calibrating impedance characteristics and a data masking signal (DQM) terminal for masking input data. In FIG. 9, "cal" represents an impedance calibration command applied from a memory controller (not shown), and "DQM" represents a data masking signal applied from the memory controller. An impedance calibration command "cal" is commonly applied to the respective semiconductor memory devices 90-1 to 90-9, but a data masking signal DQM is separately applied to the respective semiconductor memory devices 90-1 to 90-9.

Functions of the components of FIG. 9 are the same as those of FIG. 2, and a resistance value of the reference resistor RQ is equal to that of FIG. 2. Merely, the semiconductor memory devices 90-1 to 90-9 perform an impedance calibration thereof only when an impedance calibration command "cal" is applied and a data masking signal DQM is activated. Thus, the memory controller (not shown) can sequentially or selectively apply a data masking signal DQM to the semiconductor memory devices 90-1 to 90-9 to sequentially or selectively perform an impedance calibration.

Figure 10:
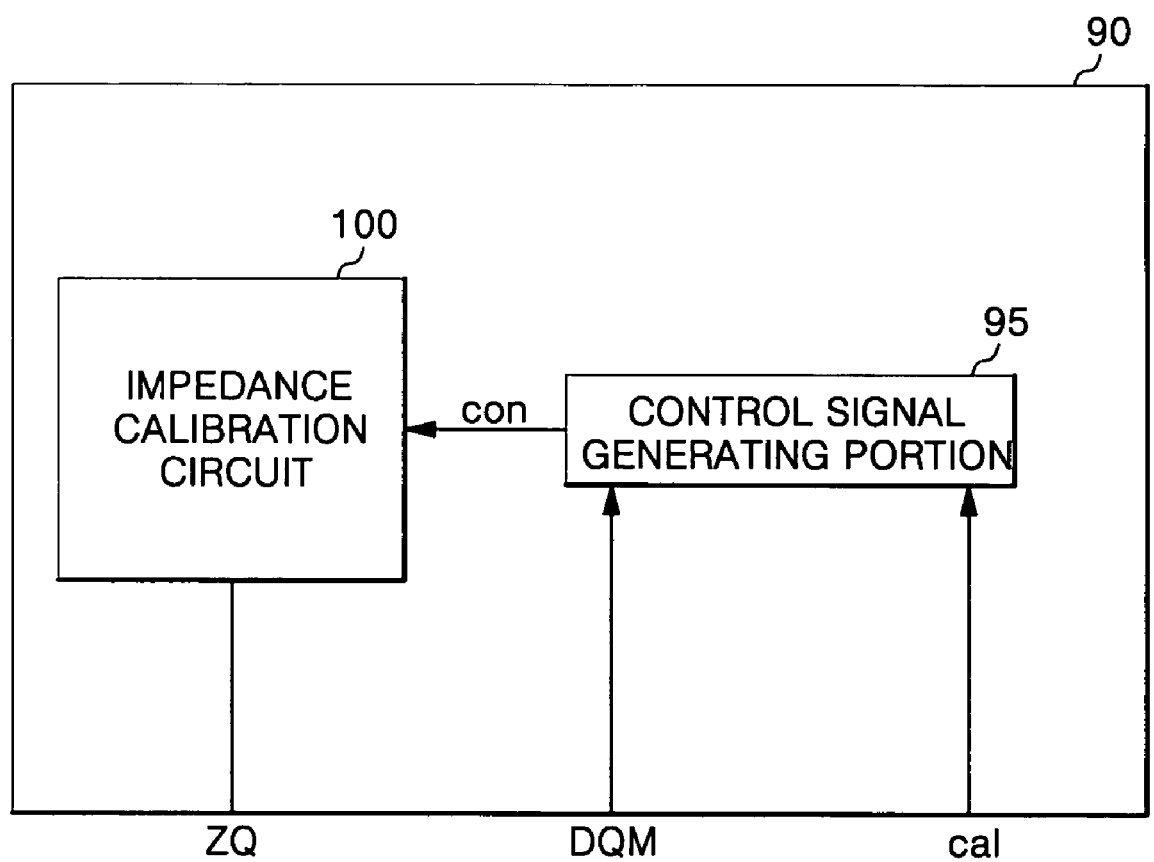
FIG. 10 is a block diagram illustrating a semiconductor memory device of the memory module of FIG. 9.

FIG. 10 is a block diagram illustrating an exemplary semiconductor memory device of the memory module of FIG. 9. The semiconductor memory module of FIG. 10 includes a control signal generating portion 95 and an impedance calibration circuit 100.

Functions of the components of FIG. 10 are explained below. The control signal generating portion 95 outputs a control signal "con" in response to an impedance calibration command "cal" and a data masking signal (DQM). For example, when the data masking signal DQM is activated, the control signal generating portion 95 receives a calibration command "cal" applied from an external portion to generate a control signal "con" in response to a mode setting command. The impedance calibration circuit 100 performs an impedance calibration of the semiconductor memory device in response to the control signal "con".

That is, the memory module of FIG. 9 and the semiconductor memory device of FIG. 10 use a data masking signal DQM for masking input data as a selection signal for selecting a semiconductor memory device which is to perform an impedance calibration in the event the memory module performs an impedance calibration. Accordingly, the memory controller can sequentially or selectively apply a data masking signal DQM to the semiconductor memory devices 90-1 to 90-9 to sequentially or selectively perform an impedance calibration. In FIGS. 9 and 10, a data masking signal DQM is as an example of a signal for selecting a semiconductor memory device which is to perform an impedance calibration, but one of input/output data signals can also be used as a signal for selecting a semiconductor memory device.

In the present disclosure, impedance calibrations of the semiconductor memory devices have been explained. However, those of ordinary skill in the pertinent art will recognize that the teachings of the present disclosure can be applied to calibrating other electrical characteristics other than impedance characteristics.

Hereinbefore, the memory module and the impedance calibration method of the semiconductor memory devices according to the present disclosure can reduce the number of reference resistors used in calibration of impedance characteristics of an off-chip driver or an on-die termination circuit of the semiconductor memory devices, resulting in a lower cost, a higher special efficiency, and a simpler wiring.

It is to be understood that the embodiments that have been described herein are only exemplary, and that the present disclosure is not limited to any of these embodiments. It will be apparent to those of ordinary skill in the pertinent art that various modifications may be made to the exemplary embodiments described herein, and that all such modifications shall be deemed within the spirit and scope of the present disclosure as defined by the following claims.

What is claimed is:

1. A memory module, comprising:
a plurality of semiconductor memory devices, each respectively having a separate terminal for calibrating impedance characteristics; and
a reference resistor commonly connected to the separate terminals,
wherein each of the plurality of semiconductor memory devices further comprises an input terminal and an output terminal, and
the respective input terminals of the plurality of semiconductor memory devices are each coupled to the output terminal of the respective semiconductor memory device of a preceding stage, so that the plurality of the semiconductor memory devices perform an impedance calibration sequentially.

2. The memory module of claim 1, wherein the plurality of semiconductor memory devices performs an impedance calibration when a signal applied to the input terminal is activated, and activates a signal outputted to the output terminal when the impedance calibration is completed, respectively.

3. The memory module of claim 2, wherein each of the plurality of semiconductor memory devices comprises:
a delay portion for delaying a signal applied to the input terminal during a predetermined time period and outputting the signal to the output terminal;
a control signal generating portion for outputting a control signal in response to a signal applied to the input terminal, an output signal of the delay portion, and a calibration command applied from an external portion; and
an impedance calibration portion for calibrating impedance characteristics of the semiconductor memory device in response to the control signal.

4. The memory module of claim 2, wherein each of the plurality of semiconductor memory devices comprises:
a detecting portion for activating a signal outputted to the output terminal when a signal applied to the input terminal is activated and a difference between an impedance of the reference resistor and a calibrated impedance is below a predetermined value;
a control signal generating portion for outputting a control signal in response to a signal applied to the input terminal, an output signal of the detecting portion, and a calibration command applied from an external portion; and
an impedance calibration portion for calibrating impedance characteristics of the semiconductor memory device in response to the control signal.

5. A method of calibrating an impedance of a semiconductor memory device in a memory module having a plurality of semiconductor memory devices which each respectively include a separate terminal for calibrating impedance characteristics, comprising:
calibrating impedance characteristics by using a reference resistor commonly coupled to the separate terminals,
wherein each of the plurality of semiconductor memory devices further includes an input terminal and an output terminal, wherein the step of calibrating impedance characteristics further comprises:
sequentially performing an impedance calibration operation by using the reference resistor commonly connected to the separate terminals,
wherein the respective input terminal of each of the semiconductor memory devices is connected to the output terminal of the respective semiconductor memory device of a preceding stage.

6. The method of claim 5, wherein each of the semiconductor memory devices performs an impedance calibration when a signal applied to its respective input terminal is activated, and activates a signal outputted to the output terminal when the impedance calibration is completed.

7. The method of claim 6, wherein a time when the impedance calibration is completed is a time when a predetermined time elapses after the signal applied to the input terminal is activated.

8. The method of claim 6, wherein a time when the impedance calibration is completed is a time when a difference between an impedance of the reference resistor and a calibrated impedance is below a predetermined value.

* * * * *